(12) United States Patent
Zhao

(10) Patent No.: US 10,083,999 B1
(45) Date of Patent: Sep. 25, 2018

(54) METHOD FOR MANUFACTURING THIN FILM TRANSISTOR (TFT) ARRAY SUBSTRATE

(71) Applicant: SHENZHEN CHINA STAR OPTOELECTRONICS SEMICONDUCTOR DISPLAY TECHNOLOGY CO.,LTD, Shenzhen, Guangdong (CN)

(72) Inventor: Yang Zhao, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/575,684

(22) PCT Filed: Nov. 10, 2017

(86) PCT No.: PCT/CN2017/110325
§ 371 (c)(1),
(2) Date: Nov. 20, 2017

(30) Foreign Application Priority Data

Sep. 27, 2017 (CN) .......................... 2017 1 0885982

(51) Int. Cl.
*H01L 21/00* (2006.01)
*H01L 21/16* (2006.01)
*H01L 27/12* (2006.01)
*G02F 1/1368* (2006.01)
*H01L 29/24* (2006.01)
*H01L 29/786* (2006.01)

(52) U.S. Cl.
CPC ........ *H01L 27/1288* (2013.01); *G02F 1/1368* (2013.01); *H01L 27/127* (2013.01); *H01L 27/1225* (2013.01); *H01L 29/247* (2013.01); *H01L 29/78693* (2013.01)

(58) Field of Classification Search
CPC ............... H01L 27/1225; H01L 27/127; H01L 27/1288; G02F 1/1368
USPC ........................................................ 438/104
See application file for complete search history.

(56) References Cited

U.S. PATENT DOCUMENTS 9,147,607 B1 * 9/2015 Bayraktaroglu .. H01L 29/66742
2015/0137113 A1 * 5/2015 Yu ........................ H01L 29/7869
257/43

* cited by examiner

*Primary Examiner* — David S Blum
(74) *Attorney, Agent, or Firm* — Kirton McConkie; Evan R. Witt

(57) ABSTRACT

The present invention provides a method for manufacturing a TFT array substrate, comprises: providing a substrate; depositing a metal gate electrode, an insulating layer, and a metal oxide layer on a surface of the substrate; forming a first metal layer on a surface of the metal oxide layer; depositing a photoresist layer on the first metal layer and implementing a photolithography process to the first metal layer to be configured as a second metal layer, a channel is defined in the second metal layer; and a portion of the photomask vertically corresponding to the channel of the second metal layer is extended greater than the second metal layer.

18 Claims, 4 Drawing Sheets

METHOD FOR MANUFACTURING THIN FILM TRANSISTOR (TFT) ARRAY SUBSTRATE

BACKGROUND OF INVENTION

Field of Invention

The present invention relates to displays, and particularly to a method for manufacturing a TFT array substrate.

Description of Prior Art

Thin film transistor-liquid crystal displays (TFT-LCDs) are the most widely used flat panel displays. With methods for manufacturing liquid crystal displays becoming more and more mature and advanced, manufacturing process is simplified, manufacturing time is reduced, and an important way for competing in the industry is to increase process efficiency to reduce production costs.

Indium gallium zinc oxide (IGZO) is amorphous oxide including indium, gallium, and zinc. The IGZO has a high mobility rate, and a mobility rate of current carrier is 20-30 times more than amorphous silicon to improve charge-discharge speed between the TFT and pixel electrode, and has a high on current and a low off current to rapidly turn on and off, to improve pixel response speed, to have faster refresh rates, and improve a line scanning rate of pixels to make TFT-LCDs have an ultrahigh resolution.

Referring to FIG. 1, in a conventional IGZO 4 MASK process, because a halftone photomask 101 has a source and drain electrode metal layer 205 and the IGZO 204 exposed at the same time, then is etched 2 or 3 times by acid, a channel 206 is formed. Because of multiple acid etchings, the source and drain electrode metal layer 205 and the IGZO 204 become over etched.

SUMMARY OF THE INVENTION

The application mainly provides a method for manufacturing a TFT array substrate to avoid a problem of the source and drain electrode metal layer and the IGZO being over etched during more times etching and to improve a finished product ratio of a process of manufacturing TFT array substrate.

For the above-mentioned objective, the present disclosure employs the following technical schemes.

A method for manufacturing a TFT array substrate, comprising:
a step S10 of providing a substrate;
a step S20 of depositing a metal gate electrode on a surface of the substrate;
a step S30 of forming an insulating layer on a surface of the metal gate electrode;
a step S40 of forming a metal oxide layer on a surface of the insulating layer;
a step S50 of forming a first metal layer on a surface of the metal oxide layer;
a step S60 of depositing a photoresist layer on a surface of the first metal layer and implementing a first photolithography process with a photomask to the first metal layer to be configured as a second metal layer, wherein a channel is defined in the second metal layer;
a step S70 of employing a second photolithography process with a photomask to the second metal layer; and
wherein, a portion of the photomask vertically corresponding to the channel of the second metal layer is extended greater than the second metal layer.

In the method for manufacturing the TFT array substrate, the photomask of the step S60 is a halftone photomask.

In the method for manufacturing the TFT array substrate, the second metal layer is a source and drain electrode metal layer.

In the method for manufacturing the TFT array substrate, the metal oxide layer is an indium gallium zinc oxide layer.

In the method for manufacturing the TFT array substrate, a portion of the halftone photomask vertically corresponding to the channel of the second metal layer is extended greater than the second metal at least 1 μm.

In the method for manufacturing the TFT array substrate, an unilateral length of the first metal layer is greater than an unilateral length of the second metal layer from 1 μm to 3 μm.

In the method for manufacturing the TFT array substrate, the step S60 further comprises implementing a third photolithography process with the halftone photomask to the indium gallium zinc oxide layer.

In the method for manufacturing the TFT array substrate, after a first photolithography process to the source and drain electrode metal layer, a third photolithography process is employed to the indium gallium zinc oxide layer.

In the method for manufacturing the TFT array substrate, the first photolithography process of the source and drain electrode metal layer and the third photolithography process of the indium gallium zinc oxide layer are implemented at the same time.

A method for manufacturing a TFT array substrate, comprising:
a step S10 of providing a substrate;
a step S20 of depositing a metal gate electrode on a surface of the substrate;
a step S30 of forming an insulating layer on a surface of the metal gate electrode;
a step S40 of forming a metal oxide layer on a surface of the insulating layer;
a step S50 of forming a first metal layer on a surface of the metal oxide layer;
a step S60 of depositing a photoresist layer on a surface of the first metal layer and implementing a first photolithography process with a photomask to the first metal layer to be configured as a second metal layer, wherein a channel is defined in the second metal layer; and
wherein, a portion of the photomask vertically corresponding to the channel of the second metal layer is extended greater than the second metal layer.

In the method for manufacturing the TFT array substrate, the photomask of the step S60 is a halftone photomask.

In the method for manufacturing the TFT array substrate, the second metal layer is a source and drain electrode metal layer.

In the method for manufacturing the TFT array substrate, the metal oxide layer is an indium gallium zinc oxide layer.

In the method for manufacturing the TFT array substrate, a portion of the halftone photomask vertically corresponding to the channel of the second metal layer is extended greater than the second metal at least 1 μm.

In the method for manufacturing the TFT array substrate, an unilateral length of the first metal layer is greater than an unilateral length of the second metal layer from 1 μm to 3 μm.

In the method for manufacturing the TFT array substrate, the step S60 further comprises implementing a third photolithography process with the halftone photomask to the indium gallium zinc oxide layer.

In the method for manufacturing the TFT array substrate, after a first photolithography process implemented to the source and drain electrode metal layer, a third photolithography process is employed to the indium gallium zinc oxide layer.

In the method for manufacturing the TFT array substrate, the first photolithography process of the source and drain electrode metal layer and the third photolithography process of the indium gallium zinc oxide layer are implemented at the same time.

This application provides a method for manufacturing a TFT array substrate, a portion of a photomask vertically corresponding to a channel of a second metal layer is greater than a second metal layer to avoid a problem of too much loss in a channel of the IGZO layer being made by the IGZO layer being over etched by over times etching and to improve a finished product ratio of a process of manufacturing TFT array substrate.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
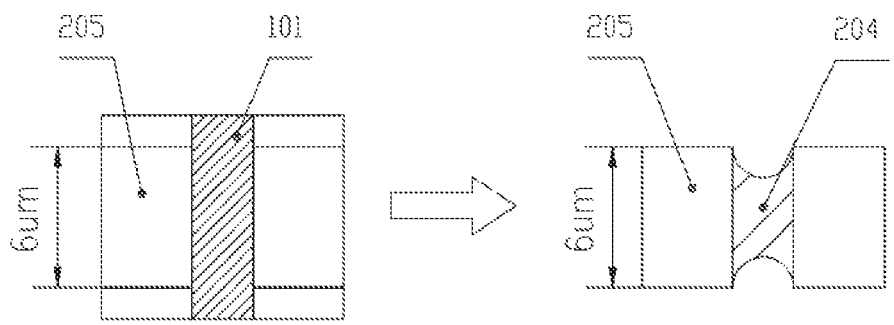
FIG. 1 is a structure diagram of a photomask in a conventional technology.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

The following combination of the attached drawings and specific embodiments will further illustrate the application.

Figure 2:
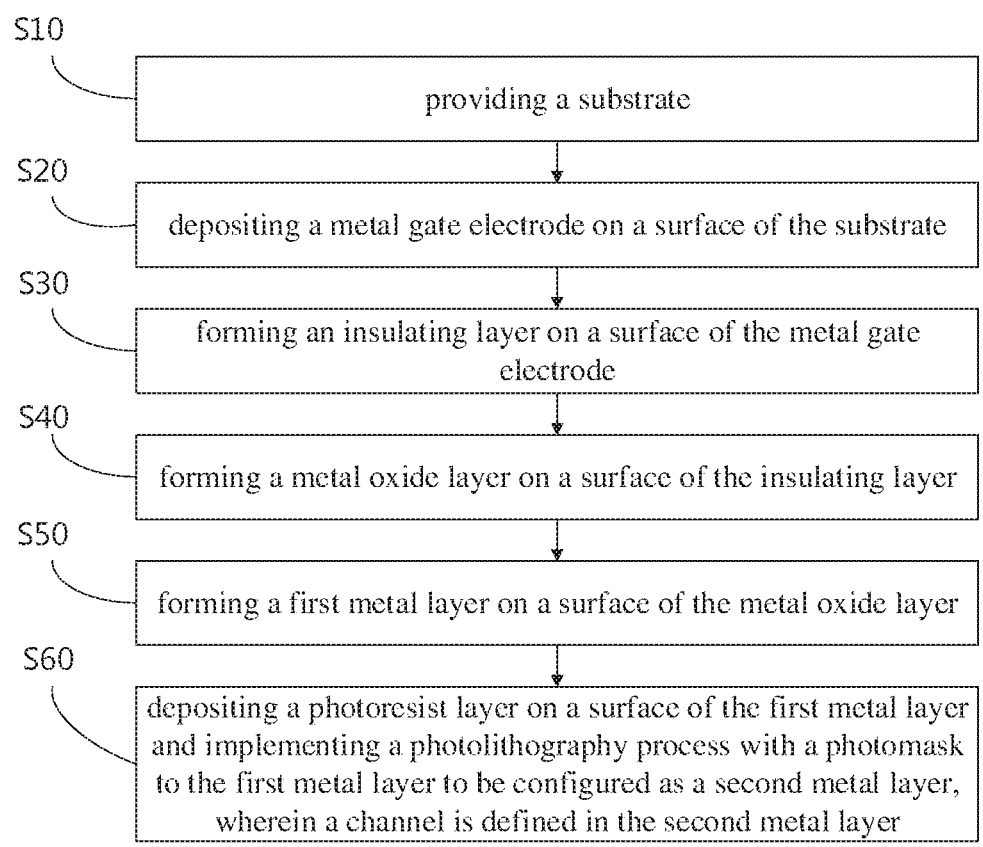
FIG. 2 is a flowchart of a method for manufacturing a TFT array substrate according to one exemplary embodiment of the present disclosure.

FIG. 2 is a flowchart of a method for manufacturing a TFT array substrate according to one exemplary embodiment of the present disclosure. FIGS. 3a-3f are structure diagrams of the method for manufacturing the TFT array substrate according to exemplary embodiments of the present disclosure.

Figure 3A:
FIGS. 3a-3f are structure diagrams of the method for manufacturing the TFT array substrate according to exemplary embodiments of the present disclosure.

Referring to FIG. 3a, a step S10 of providing a substrate 201.

In the step S10, the substrate 201 can be a rigid substrate, and the rigid substrate can be a glass substrate.

Figure 3B:
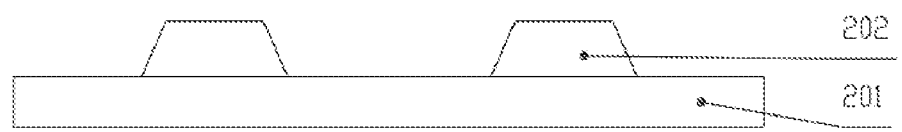

Referring to FIG. 3b, a step S20 of depositing a metal gate electrode 202 on a surface of the substrate 201.

The metal gate electrode 202 is a gate electrode of the TFT array substrate, is formed on the surface of the substrate 201 by a sputtering process, and is connected to a pixel electrode.

Figure 3C:
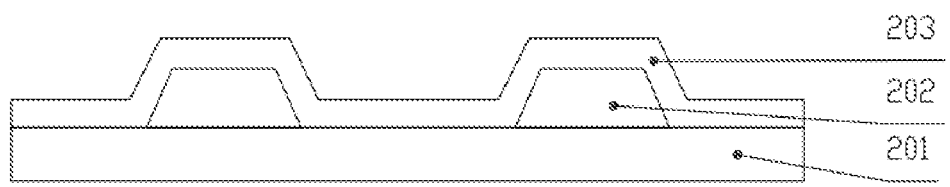

Referring to FIG. 3c, a step S30 of forming an insulating layer 203 on a surface of the metal gate electrode 202.

The insulating layer 203 of the step S30 is made one of a combination of silicon nitride or silicon oxide. The insulating layer 203 can be formed on the surface of the metal gate electrode 202 and covers the metal gate electrode 202 by physical vapor deposition.

Figure 3D:
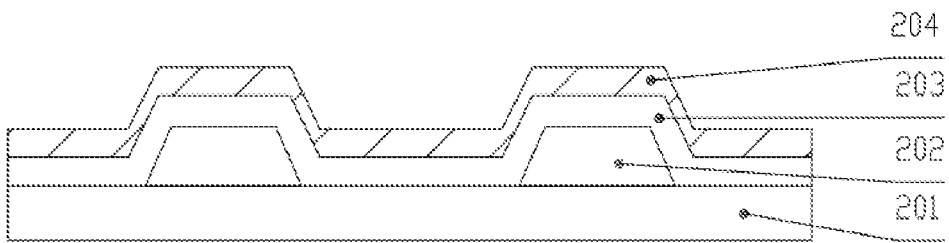

Referring to FIG. 3d, a step S40 of forming a metal oxide layer 204 on a surface of the insulating layer 203.

In this exemplary embodiment, the metal oxide layer 204 is an indium gallium zinc oxide (IGZO) layer. Non-crystal IGZO is material used in channels in a new TFT technology.

IGZO is amorphous oxide including indium, gallium, and zinc. The IGZO has a high mobility rate, and a mobility rate of current carrier is more 20-30 times than amorphous silicon to improve charge-discharge velocity between the TFT and pixel electrode, and has a high on current and a low off current to rapidly turn on and off, to improve a response speed of pixels, to have a faster refresh rate, and to improve a line scanning rate of pixels to make the TFT-LED have a ultrahigh resolution.

Figure 3E:
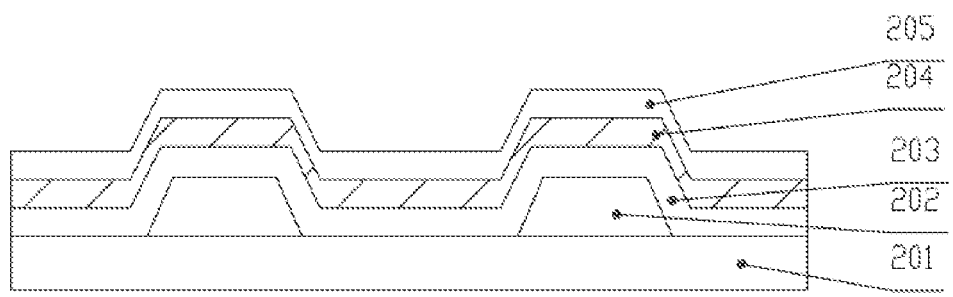

Referring to FIG. 3e, a step S50 of forming a first metal layer 205 on a surface of the metal oxide layer 204. The first metal layer 205 is a source and drain electrode metal layer and comprises a source electrode and a drain electrode of the TFT array substrate.

The first metal layer 205 is a source and drain electrode metal layer without etched. In this exemplary embodiment, an unilateral length of the first metal layer is greater 2 μm than an unilateral length of the second metal layer.

Figure 3F:
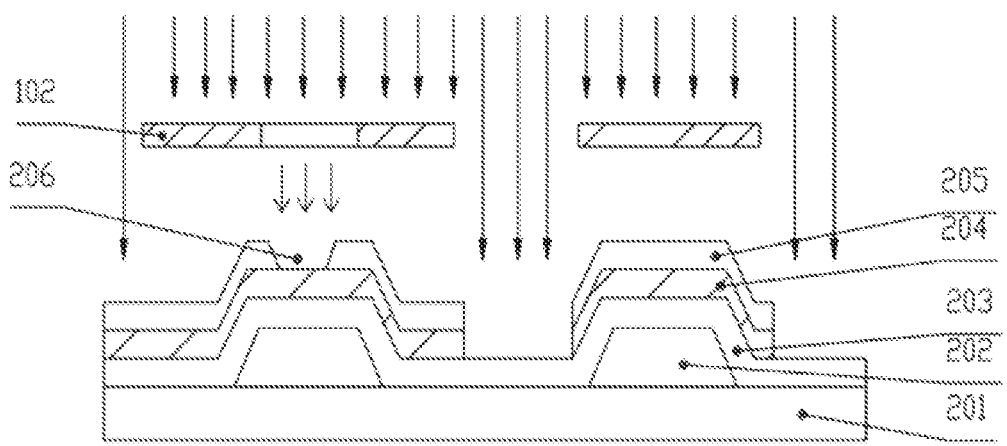
Figure 4:
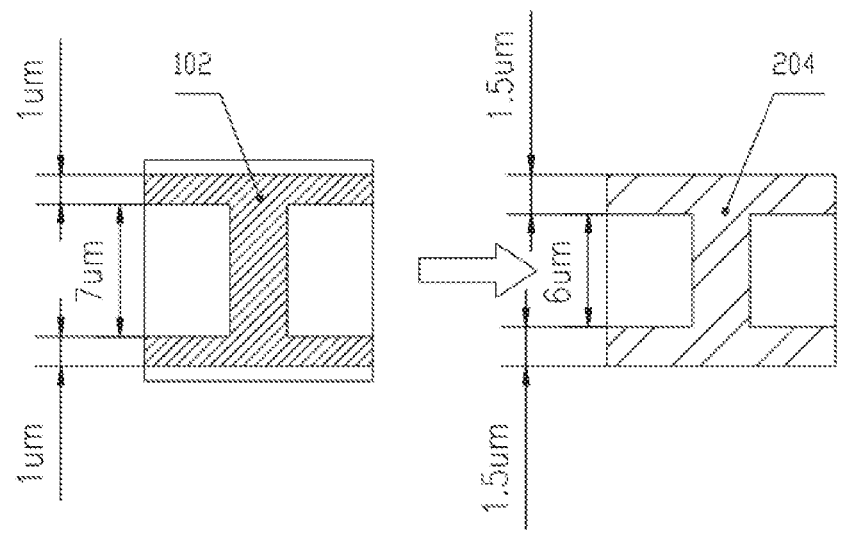
FIG. 4 is a structure diagram of a photomask according to one exemplary embodiment of the present disclosure.

Referring to FIG. 3f, a step S60 of depositing a photoresist layer on a surface of the first metal layer 205 and implementing a first photolithography process with a photomask 102 to the first metal layer 205 to be configured as a second metal layer 205a, wherein a channel 206 is defined in the second metal layer 205a.

A portion of the photomask vertically corresponding to the channel of the second metal layer 205a is extended greater than the second metal layer 205a.

The step S60 is main technical features of this application. The portion of the photomask 102 vertically corresponding to the channel 206 is greater than a second metal layer 205a, part of the indium gallium zinc oxide layer 204 is retained and perpendicular to the channel 206 by etching the first metal layer 205 to avoid a problem of too much loss in a channel 206 being over etched.

The portion of the halftone photomask vertically corresponding to the channel of the second metal layer is extended greater than the second metal at least 1 μm, because during many experiments, after the TFT array substrate is etched by three times wet etch and one time dry etch (for example, a rate W/L of the channel is 6 μm/6 μm), the indium gallium zinc oxide layer 204 is extended greater 1.5 μm than the second metal layer 205a, and the second metal layer 205a losses 1.5 μm after etched. During designing the photomask 102, the portion of the halftone photomask vertically corresponding to the channel of the second metal layer is extended greater than the second metal at least 1 μm to avoid the rate W/L of the channel reduce.

In this exemplary embodiment, a halftone photomask 102 is used for implementing a photolithography process to the indium gallium zinc oxide layer 204.

During the photolithography process, a photosensitive material is coated on a surface of an etched material, and after a lithography process, the photosensitive material protects the etched material, and a permanent graphic is formed by etching.

In this exemplary embodiment, after a photolithography process to the source and drain electrode metal layer, a photolithography process is employed to the indium gallium zinc oxide layer 204. The first metal layer 205 is etched by three times wet etch and one time dry etch in this application.

In other exemplary embodiments, a photolithography process of the source and drain electrode metal layer and a photolithography process of the indium gallium zinc oxide layer 204 are implemented at the same time. The first metal layer 205 can be etched by two times wet etch and one time dry etch in this application. This application is not limited to the two methods above In this exemplary embodiment, the method for manufacturing the TFT array substrate further comprises a step S70 of employing a second photolithography process with a photomask to the second metal layer.

The second metal layer 205a can be etched by a photolithography process with a photomask 102.

This application provides a method for manufacturing a TFT array substrate, a portion of a photomask vertically corresponding to a channel of a second metal layer is greater than a second metal layer to avoid a problem of too much loss in a channel of the IGZO layer being made by the IGZO layer being over etched by over times etching and to improve a finished product ratio of a process of manufacturing TFT array substrate.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A method for manufacturing a thin film transistor (TFT) array substrate, comprising:
   a step S10 of providing a substrate;
   a step S20 of depositing a metal gate electrode on a surface of the substrate;
   a step S30 of forming an insulating layer on a surface of the metal gate electrode;
   a step S40 of forming a metal oxide layer on a surface of the insulating layer;
   a step S50 of forming a first metal layer on a surface of the metal oxide layer;
   a step S60 of depositing a photoresist layer on a surface of the first metal layer and implementing a first photolithography process with a photomask to the first metal layer to be configured as a second metal layer, wherein a channel is defined in the second metal layer;
   a step S70 of employing a second photolithography process with a photomask to the second metal layer; and
   wherein, a portion of the photomask vertically corresponding to the channel of the second metal layer is extended greater than the second metal layer.

2. The method for manufacturing the TFT array substrate of claim 1, wherein the photomask of the step S60 is a halftone photomask.

3. The method for manufacturing the TFT array substrate of claim 2, wherein the second metal layer is a source and drain electrode metal layer.

4. The method for manufacturing the TFT array substrate of claim 3, wherein the metal oxide layer is an indium gallium zinc oxide layer.

5. The method for manufacturing the TFT array substrate of claim 4, wherein a portion of the halftone photomask vertically corresponding to the channel of the second metal layer is extended greater than the second metal at least 1 μm.

6. The method for manufacturing the TFT array substrate of claim 1, wherein an unilateral length of the first metal layer is greater than an unilateral length of the second metal layer from 1 μm to 3 μm.

7. The method for manufacturing the TFT array substrate of claim 4, wherein the step S60 further comprises implementing a third photolithography process with the halftone photomask to the indium gallium zinc oxide layer.

8. The method for manufacturing the TFT array substrate of claim 7, wherein after a first photolithography process implemented to the source and drain electrode metal layer, a third photolithography process is employed to the indium gallium zinc oxide layer.

9. The method for manufacturing the TFT array substrate of claim 7, wherein the first photolithography process of the source and drain electrode metal layer and the third photolithography process of the indium gallium zinc oxide layer are implemented at the same time.

10. A method for manufacturing a thin film transistor (TFT) array substrate, comprising:
    a step S10 of providing a substrate;
    a step S20 of depositing a metal gate electrode on a surface of the substrate;
    a step S30 of forming an insulating layer on a surface of the metal gate electrode;
    a step S40 of forming a metal oxide layer on a surface of the insulating layer;
    a step S50 of forming a first metal layer on a surface of the metal oxide layer;
    a step S60 of depositing a photoresist layer on a surface of the first metal layer and implementing a first photolithography process with a photomask to the first metal layer to be configured as a second metal layer, wherein a channel is defined in the second metal layer; and
    wherein, a portion of the photomask vertically corresponding to the channel of the second metal layer is extended greater than the second metal layer.

11. The method for manufacturing the TFT array substrate of claim 10, wherein the photomask of the step S60 is a halftone photomask.

12. The method for manufacturing the TFT array substrate of claim 11, wherein the second metal layer is a source and drain electrode metal layer.

13. The method for manufacturing the TFT array substrate of claim 12, wherein the metal oxide layer is an indium gallium zinc oxide layer.

14. The method for manufacturing the TFT array substrate of claim 13, wherein a portion of the halftone photomask vertically corresponding to the channel of the second metal layer is extended greater than the second metal at least 1 μm.

15. The method for manufacturing the TFT array substrate of claim 10, wherein an unilateral length of the first metal layer is greater than an unilateral length of the second metal layer from 1 μm to 3 μm.

16. The method for manufacturing the TFT array substrate of claim 13, wherein the step S60 further comprises implementing a third photolithography process with the halftone photomask to the indium gallium zinc oxide layer.

17. The method for manufacturing the TFT array substrate of claim 16, wherein after a first photolithography process implemented to the source and drain electrode metal layer, a third photolithography process is employed to the indium gallium zinc oxide layer.

18. The method for manufacturing the TFT array substrate of claim 16, wherein the first photolithography process of the source and drain electrode metal layer and the third photolithography process of the indium gallium zinc oxide layer are implemented at the same time.

\* \* \* \* \*